United States Patent [19]
Braun et al.

[11] Patent Number: 5,718,361
[45] Date of Patent: Feb. 17, 1998

[54] APPARATUS AND METHOD FOR FORMING MOLD FOR METALLIC MATERIAL

[75] Inventors: Carol Jill Braun, LaGrangeville; James Howard Covell, II, Poughkeepsie, both of N.Y.

[73] Assignee: International Business Machines Corporation, Armonk, N.Y.

[21] Appl. No.: 561,571

[22] Filed: Nov. 21, 1995

[51] Int. Cl.[6] .................................................. H01L 21/60
[52] U.S. Cl. .................... 228/56.3; 164/47; 228/180.22; 228/253
[58] Field of Search ........................ 228/180.22, 253, 228/254, 56.3; 427/96; 164/47

[56] References Cited

U.S. PATENT DOCUMENTS

| | | | |
|---|---|---|---|
| 4,434,134 | 2/1984 | Darrow et al. | 419/5 |
| 4,750,889 | 6/1988 | Ignasiak et al. | 439/83 |
| 4,914,814 | 4/1990 | Behun et al. | 29/843 |
| 5,029,748 | 7/1991 | Lauterbach et al. | 228/180.1 |
| 5,048,747 | 9/1991 | Clark et al. | 228/180.2 |
| 5,244,143 | 9/1993 | Ference et al. | 228/180.21 |
| 5,551,148 | 9/1996 | Kazui et al. | 228/180.22 |

*Primary Examiner*—Kenneth J. Ramsey
*Attorney, Agent, or Firm*—Aziz M. Ahsan

[57] ABSTRACT

The present invention relates generally to a new apparatus and method for molding metallic materials, such as, for example, solder. More particularly, the invention encompasses an apparatus that is used to form metallic interconnections, such as, for example, solder connections, such as, BGA (Ball Grid Array) or CGA (Column Grid Array) in a mold for later use to electrically or mechanically connect two devices, such as, for example, semiconductor devices. A method for forming the metallic connections that are used to electrically or mechanically connect two devices, such as, for example, semiconductor devices is also disclosed. However, these metallic interconnections in a mold could also be used to form other structures, such as, for example, heat sinks with fins, etc.

44 Claims, 3 Drawing Sheets

APPARATUS AND METHOD FOR FORMING MOLD FOR METALLIC MATERIAL

CROSS-REFERENCE TO RELATED PATENT APPLICATION

This Patent Application is related to U.S. patent application Ser. No. 08/562,079, entitled "Mold Transfer Apparatus and Method", filed on Nov. 21, 1995, which is assigned to the assignee of the instant Patent Application, and the disclosure of which is incorporated herein by reference.

FIELD OF THE INVENTION

The present invention relates generally to a new apparatus and method for molding metallic materials, such as, for example, solder. More particularly, the invention encompasses an apparatus that is used to form metallic interconnections, such as, for example, solder connections, such as, BGA (Ball Grid Array) or CGA (Column Grid Array) in a mold for later use to electrically or mechanically connect two devices, such as, for example, semiconductor devices. A method for forming the metallic connections that are used to electrically or mechanically connect two devices, such as, for example, semiconductor devices is also disclosed. However, these metallic interconnections in a mold could also be used to form other structures, such as, for example, heat sinks with fins, etc.

BACKGROUND OF THE INVENTION

Semiconductor devices are becoming more prevalent in our society. The semiconductor manufacturers are therefore constantly being challenged to improve the quality of their products and to reduce their costs. Whereas significant improvements are being made to the processes used. Process improvements alone are not sufficient to reduce costs and increase quality of the semiconductor devices.

The semiconductor industry has used a variety of approaches to achieve electrical and mechanical interconnections. Following are some examples of the processes and apparatuses:

U.S. Pat. No. 4,434,134 (Darrow et al.), entitled "Pinned Ceramic Substrate" describes a sintering method to form pins in a ceramic substrate using powdered metallurgy paste. It uses a consumable mold with preformed holes which are mated to the sintered powdered filled holes of a ceramic substrate. The holes in the mold are then filled with powdered metallurgy paste and the mold/substrate assembly is heat treated to evaporate the mold and fuse the sintered metallurgy of the mold holes with sintered metallurgy in the ceramic holes to form pins.

U.S. Pat. No. 4,914,814 (Behun et al.) entitled "Process of Fabricating a Circuit Package" discloses a low cost process for fabricating solder column interconnections for an electronic package. Basically, an array of pin holes in a pin mold is filled with lead-tin solder, which are in registration with an array of conductive pads. The whole assembly is heated such that the solder becomes molten and coalesces with the array of the conductive pads, and the pin mold is then removed.

U.S. Pat. No. 5,029,748 (Lauterbach et al.), entitled "Solder Preforms in a Cast Array" describes a method to cast solder preforms to be used in a reflow solder process to join electrical connector pins to plated though holes in a printed circuit board. The solder preforms can be cast directly onto the pins in a through-hole printed circuit board connector. The pins and preforms can be inserted into the plated through-holes of the printed circuit board.

U.S. Pat. No. 5,048,747 (Clark et al.), entitled "Solder Assembly of Components" describes a method of attaching a first component to a second component. Precise amounts of solder are provided to each pad. The holes in the component are aligned with the pads and the solder is reflowed so that a visible solder fillet is formed above the holes to permit inspection of the solder joint.

U.S. Pat. No. 5,244,143 (Ference et al.), entitled "Apparatus and Method for Injection Molding Solder and Application Thereof", primarily addresses injection molding solder molds directly onto electronic component. A method for mold filling and transfer to a substrate is also disclosed. The invention provides for uniform solder volumes on the corresponding component grid array.

However, a cost effective method is required to produce metallic interconnects, such as, for example, solder interconnects. As an example, utilizing solder filled molds of this invention provides a low cost solution. The material cost of solder filled molds is an order of magnitude less than using the traditional solder ball and paste to form BGA (Ball Grid Array) or SBC (Solder Ball Connect) and pre-cut wire to form solder CGA (Column Grid Array) module interconnections.

This invention also provides and uses molds that are pre-filled with solid solder interconnects. The filled molds can be stored and subsequently the filled molds can be mated with a carrier and the assembly heated to reflow and wet the metallic material, such as, solder, to the metallurgical pads on a semiconductor device, such as, a substrate.

This invention describes a method to cast solder inside a mold and lock it in place prior to reflow onto a carrier. Basically, the shape of the mold determines the final interconnect structure.

This invention also describes the design and use of filled molds and transfer of molds to carriers to form metallic interconnect, such as, solder interconnect, structures.

This invention also allows for mold array inspection prior to join to the carrier.

This invention also addresses solder injection mold design, filling and handling considerations.

PURPOSES AND SUMMARY OF THE INVENTION

The invention is a novel method and an apparatus for forming arrays of metallic structures or interconnect structures.

Therefore, one purpose of this invention is to provide an apparatus and a method that will provide a reliable and repeatable casting process and apparatus.

Another purpose of this invention is to provide for transfer of molded or cast features onto a part.

Still another purpose of this invention is to have a means of aligning a mold to the part.

Yet another purpose of this invention is to provide a reliable means of retaining cast structures in a mold, and a means to release same.

Still yet another purpose of the invention is to produce cast preforms in a finished shape.

Yet another purpose of the invention is to be able to provide a mold that can be designed to provide various shaped interconnections.

Therefore, in one aspect this invention comprises a process for making transferable cast metallic interconnect using a stand-alone mold, comprising the steps of:

(a) placing metallic material in a liquid state, into at least one hole in said mold, (b) cooling said metallic material in said mold to the solidus temperature of said metallic material, and thereby forming said cast metallic interconnect in said mold.

In another aspect this invention comprises a mold having cast metallic interconnects made by the above-mentioned inventive process.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

This invention discloses an apparatus and a method for pre-filling metallic features, such as, for example, solder, in a mold and to lock the metallic features in place to form cast metallic feature interconnects.

For the ease of understanding this invention solder will be used as the metallic material, however, it should be understood that any material that can be molded or cast can be used to fill the mold of this invention.

This process allows the locking of the interconnects in place inside the mold. These locked metallic interconnects locked in the mold can be easily transferred onto the desired component to form interconnect structures. This transfer is typically done by aligning the cast interconnect in the mold with a carrier, such as, a semiconductor device, and then heating and reflowing the interconnects and thereby joining them to the semiconductor device.

It is preferred that the interconnects in the mold are physically in contact with metallurgical pads on the semiconductor device, such as, a substrate. The shape of the openings in the mold determines the final interconnect structure shape. This invention allows for the easy inspection of the cast interconnection surface. The surface can be inspected before it is mated or joined to a semiconductor device or carrier.

Figure 1:
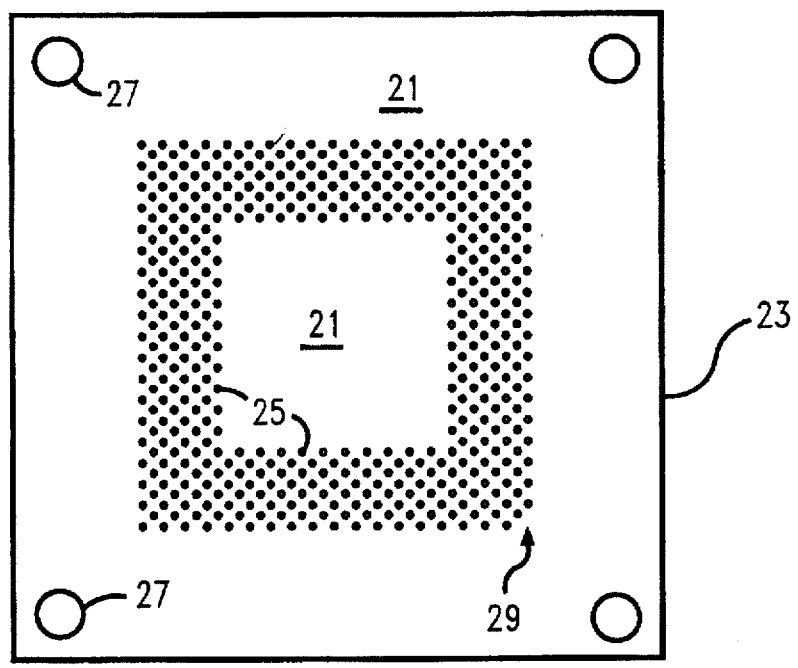
FIG. 1, illustrates a top view of a preferred embodiment of this invention.

FIG. 1, illustrates one preferred embodiment of this invention, where a mold 23, has a plurality of openings 25. For orientation or similar other purposes one could have an area 29, that does not have any opening 25. Similarly, one could have an area 21, in the mold that does not have any opening 25. For alignment or similar other purposes it is preferred to have at least one opening 27, in the mold 23.

Any material can be used to make the mold 23, as long as it can withstand the service temperatures and has dimensional stability. For the purposes of understanding this invention, however, the preferred material that was used to make the mold 23, was a carbon-graphite composite of the appropriate grade with a thermal coefficient of expansion (TCE) that closely matched the TCE of the semiconductor device to which it was to be mated, as will be explained in more detail later. One such composite used, for example, was DFP-1, manufactured by POCO Graphite Incorporated, Decatur, Tex., USA, having a TCE of about 4.27×10E6 inches per inch per degree Fahrenheit.

Graphite has been found to be an ideal mold material due to its TCE (Thermal Coefficient of Expansion) match to ceramic substrates, non-wettable surface and releasing properties.

The material for the mold should also be inert to the material that it will be filled with, such as, molten solder, such as, for example, about 10 percent tin and about 90 percent lead, by weight. For the ease of understanding this invention solder will be used as an example for filling the openings 25, however, any material that can be cast can be used to fill the mold openings 25. Unless otherwise specified all percentages for the cast metal are in weight percent.

The mold 23, itself could be made from, for example, a group comprising boron nitride, ceramics, copper, epoxy, glass, graphite, metals, metallic ceramics, molybdenum, plastics, polyimides, silicones, to name a few.

The material that is used to fill the opening 25, in the mold 23, itself could be selected from a group comprising, aluminum, antimony, bismuth, copper, gold, lead, silver, tin or alloys thereof. However, conductive epoxies could also be used to fill the opening 25, in the mold 23.

The shape of the opening 25, could be selected from a group comprising, triangular shape, rectangular shape, polygonal shape, elliptical shape or any odd shape, to name a few.

The substrate could be selected from a group comprising, board, card, ceramics, glass-ceramics, chip or semiconductor substrate, to name a few.

The mold 23, should also possess sufficient dimensional stability for use at an appropriate service temperature, for example, about 350° C. At the service temperature the mold 23, must be able to retain adequate flatness and parallelism for successful filling of the openings 25. This filling of the openings 25, could be done using any type of an injection molded solder device, such as, for example, the apparatus disclosed in U.S. Pat. No. 5,244,143 (Ference, et al.), the disclosure of which is incorporated herein by reference.

The mold 23, could also be used to form a column grid preform array of tin lead solder, such as, a 10–90 (by weight) tin lead solder, for attachment to an electronic device, such as, a ceramic substrate.

Figure 2:
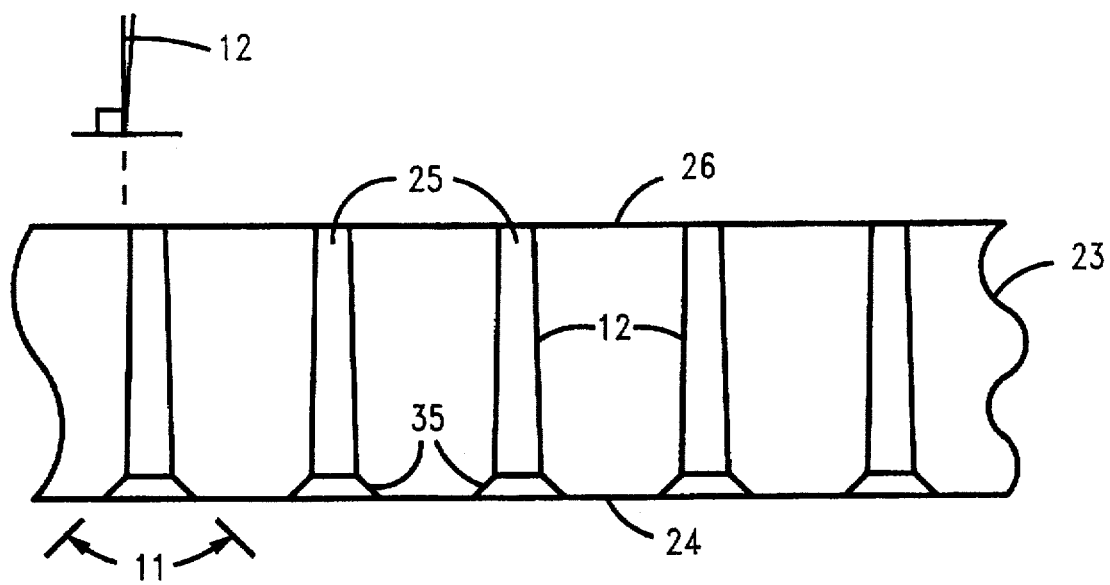
FIG. 2, illustrates a cross-sectional side view of another preferred embodiment of this invention.

FIG. 2, illustrates a side view of another preferred embodiment of this invention. The mold 23, has a lower surface 24, and an upper surface 26, and mold cavities or holes 25. It is preferred that the mold cavities or holes 25, have at least a small taper or draft angle 12. This taper 12, is primarily incorporated to facilitate the ejection of the cast solder mold after it has been attached to the semiconductor device, such as, a ceramic substrate.

It is also preferred for some applications that one of the surfaces of the mold 23, also has a flared end 35, having a flare angle 11, for the mold cavity 25. As will be discussed later, this flared end 35, will form a fillet area at the device attachment site. In addition to minimizing attachment point stress, this flared area 35, also ensures solder contact with the substrate metallized pads due to the bulging phenomenon as explained later.

Figure 3:
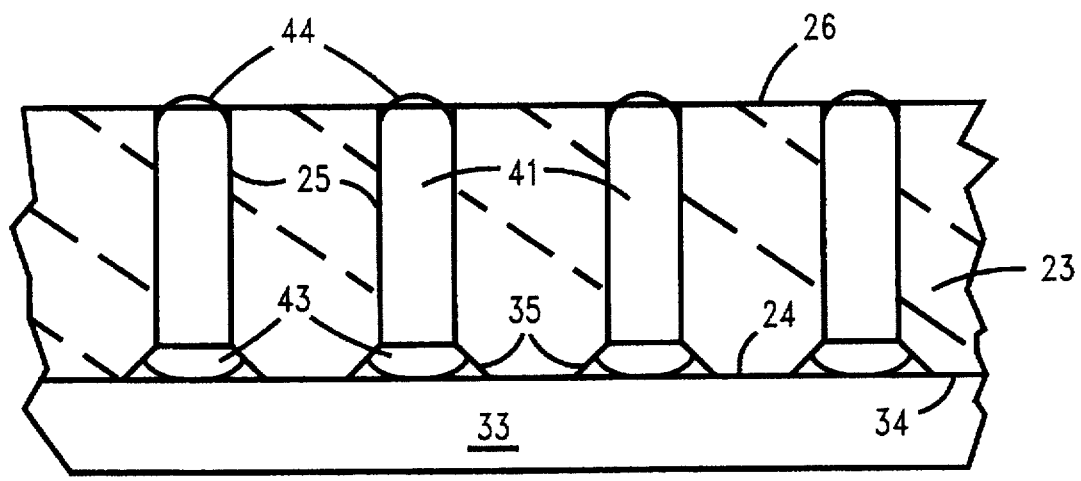
FIG. 3, illustrates a cross-sectional view of yet another preferred embodiment of this invention, where the inventive mold of this invention has been filled with solder material.

FIG. 3, illustrates yet another preferred embodiment of this invention, where the inventive mold of this invention has been filled with solder material. The mold filling is accomplished by aligning the lower surface 24, of the mold 23, against upper surface 34, of a flat or backing plate 33. The flat plate chosen for this application was made from graphite, however, any compatible material, depending upon the application, can be used.

The unfilled mold 23, was heated to about 345° C. minimum, and then this heated assembly was driven under the injection head of a solder injection molding machine, in an inert atmosphere, such as, containing minimal oxygen or less than 500 PPM (Parts Per Million) of oxygen by volume. Solder 41, was then injected into the through-hole 25, and the solder formed a bulge-like structure 43, within the flare area 35. This bulge like structure is due to the higher surface tension forces in an inert atmosphere. For most applications it is preferred to have some extra material at the tail end 44, of the solder 41, at the open end of the hole 25. However, for some applications and with the use of an appropriate molding device and/or atmospheric conditions the area 44, might be kept flush with the upper surface 26, of the mold 23.

Since this mold design was of the through-hole type, the flat plate 33, in addition to supporting and transporting the mold 23, also acts as a removable die surface. These functions make expansion matching of the mold and support/base a requirement.

The process of filling the cavities 25, with the solder 41, itself is limited in speed by the liquid flow rate within the solder injection head and mold heating capacity of the equipment.

Figure 4:
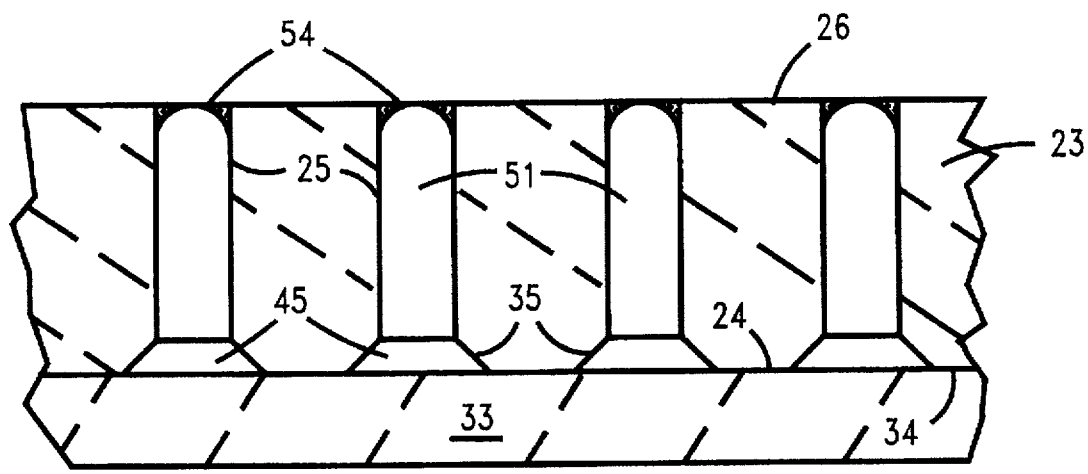
FIG. 4, illustrates the inventive mold having the solder material shown in FIG. 3, filled in a relatively higher oxygen environment.

FIG. 4, illustrates the inventive mold having the solder material shown in FIG. 3, deposited in a similar manner, but deposited in an atmosphere containing a higher level of oxygen (such as, for example, higher than 2,000 PPM of oxygen by volume) than in FIG. 3, and forming cast solder 51. As can be clearly seen in FIG. 4, the cast solder 51, has a head 45, and a rounded tail or tip 54. The head 45, maintains it's shape definition due to the very slight surface oxidation in the solder, which counteracts the surface tension forces that tend to resist maintaining a sharply defined cross-section.

Figure 5:
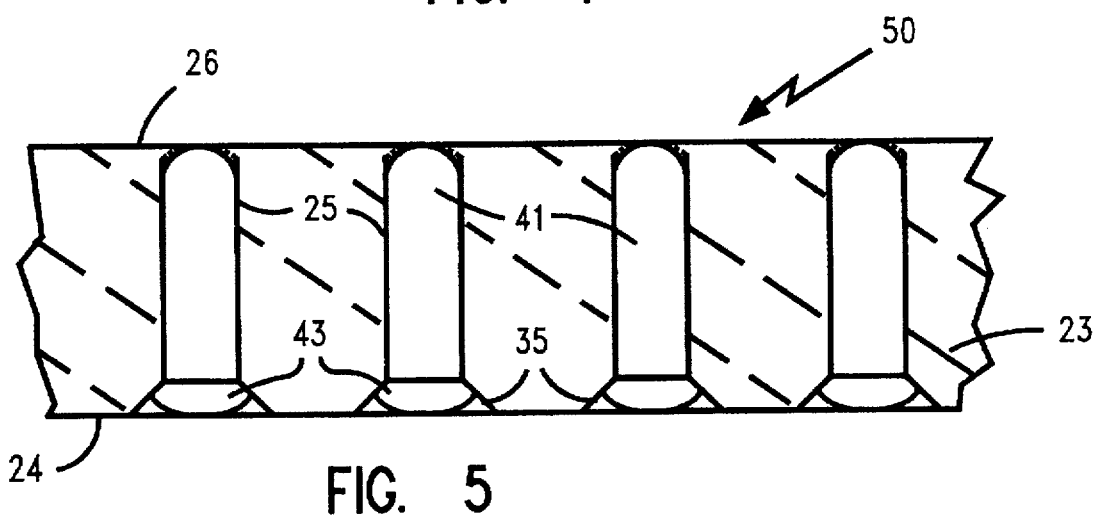
FIG. 5, illustrates the inventive mold shown in FIG. 3, and containing the solder material after the removal of the backing material.

FIG. 5, illustrates the inventive mold 23, shown in FIG. 3, and containing the deposited solder material 41, after the removal of the backing plate 33. After the solder 41, has solidified, the filled mold 23, is separated from the base or backing plate 33, to form a filled or casted mold 50. The filled mold 50, can now either be used to immediately attach the cast solder 41, to a semiconductor device or the casted mold 50, could be stored as a stocked item to be used later.

The release of the cast solder 41, from the filled mold 50, is facilitated by the release draft angle 12, and if necessary, by using a vacuum assisted handler (not shown).

It is preferred that the filled mold 50, is stored in an inert atmosphere. This would prevent any oxidation of the cast solder that may be exposed.

The filled mold 50, having an array of cast solder interconnects 41, can also now be easily inspected prior to any joining, such as, for example, to a carrier or semiconductor device.

Figure 6:
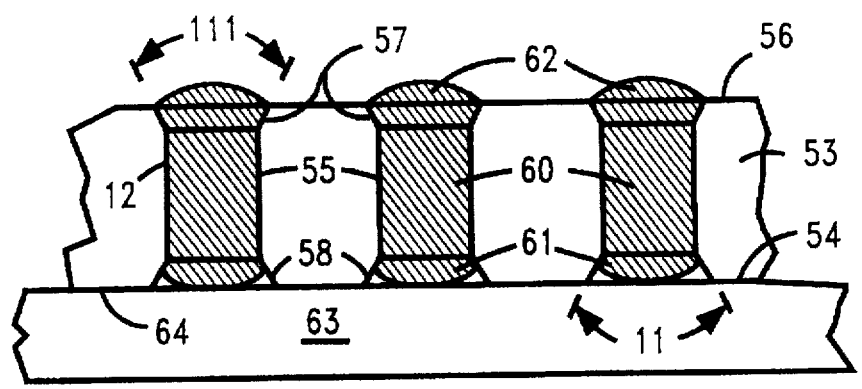
FIG. 6, is a cross-sectional view of still another embodiment of the invention.

FIG. 6, is a cross-sectional view of still another embodiment of the invention. This configuration is typically used to form BGA (Ball Grid Array) like interconnections between a semiconductor substrate and printed circuit card. In addition to the aforementioned cost benefits associated with using bulk solder rather than precision manufactured balls, this invention offers enhanced reworkability for removal of substrate from card. The connection formed by this invention results in an interconnection array that remains attached to the substrate during rework. In contrast, the traditional BGA process has lower melting point interfaces at both the substrate and card, resulting in the balls remaining on either the card or substrate, requiring an additional rework cycle.

As shown in FIG. 6, a mold 53, having through-hole 55, has a dual taper 57 and 58. The first taper 57, is on the upper surface 56, while the second taper 58, is on the lower surface 54, of the mold 53. The first taper 58, could have a flare angle 11, while the second taper 57, could have a flare angle 111.

The filling of the mold 53, is accomplished by aligning the lower surface 54, of the mold 53, against upper surface 64, of a flat or backing plate 63. The flat plate chosen for this application was made from graphite, however, any compatible material, depending upon the application, can be used.

The unfilled mold 53, was heated to about 345° C. minimum in an inert atmosphere, and then this assembly was driven under the injection head of a solder injection molding machine. Solder 60, was then injected into the through-hole 55, and the solder formed a bulge-like structure 61, within the taper or flare area 58. For most applications it is preferred to have some extra material 62, of the solder 60, at the open end of the hole 55. However, for some applications and with the use of some machines the area 62, might be kept flush with the upper surface 56, of the mold 53.

Since this mold design was of the through-hole type, the plate 63, in addition to supporting and transporting the mold 53, also acts as a removable die surface. These functions make expansion matching of the mold and support/base a requirement.

As stated earlier that the process of filling the cavities 55, with the solder 60, itself is limited in speed by the liquid flow rate within the solder injection head and the mold heating capacity of the equipment.

Figure 7:
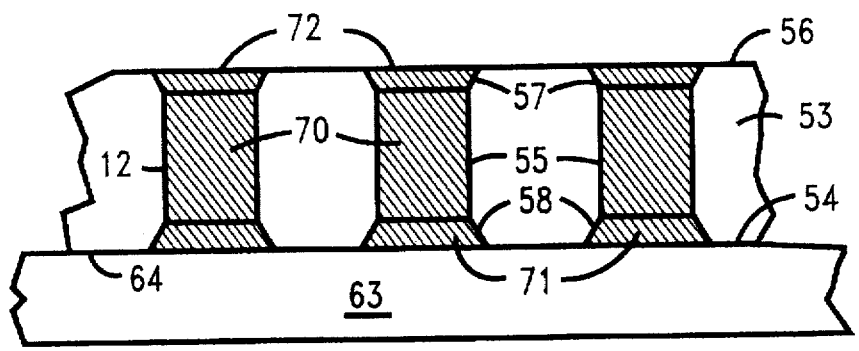
FIG. 7, illustrates the inventive mold having the solder material shown in FIG. 6, filled in a relatively higher oxygen environment.

FIG. 7, illustrates the inventive mold having the solder material shown in FIG. 6, deposited in a similar manner, but deposited in an atmosphere containing a higher level of oxygen (such as, for example, higher than 2,000 PPM of oxygen by volume) than in FIG. 6, and forming cast solder 70. As can be clearly seen in FIG. 7, the cast solder 70, has a head 71, and a rounded tail or tip 72. The head 71, maintains it's shape definition due to the very slight surface oxidation in the solder, which counteracts the surface tension forces that tends to resist maintaining a sharply defined cross-section.

Figure 8:
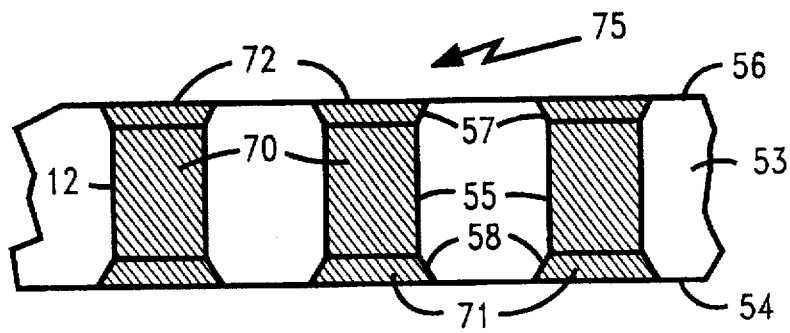
FIG. 8, illustrates the inventive mold shown in FIG. 7, and containing the solder material after the removal of the backing material.

FIG. 8, illustrates the inventive mold 53, shown in FIG. 7, and containing the cast or molded solder material after the removal of the backing plate 63. After the solder 70, has solidified, the filled mold 53, is separated from the baseplate 63, to form filled or cast mold 75. The filled mold 75, can now either be used to immediately attach the cast solder 70, to a carrier (not shown) or the cast mold 75, could be stored as a stocked item to be used later.

The release of the cast solder 70, from the cast mold 75, is facilitated by the release taper 12, and if necessary, by using a vacuum assisted handler.

It is preferred that the cast mold 75, is stored in an inert atmosphere. This would prevent any oxidation of the cast solder that may be exposed.

The filled mold 75, having an array of cast solder interconnects 70, can now be easily inspected and/or weighed prior to any joining to a carrier or semiconductor device.

Figure 9:
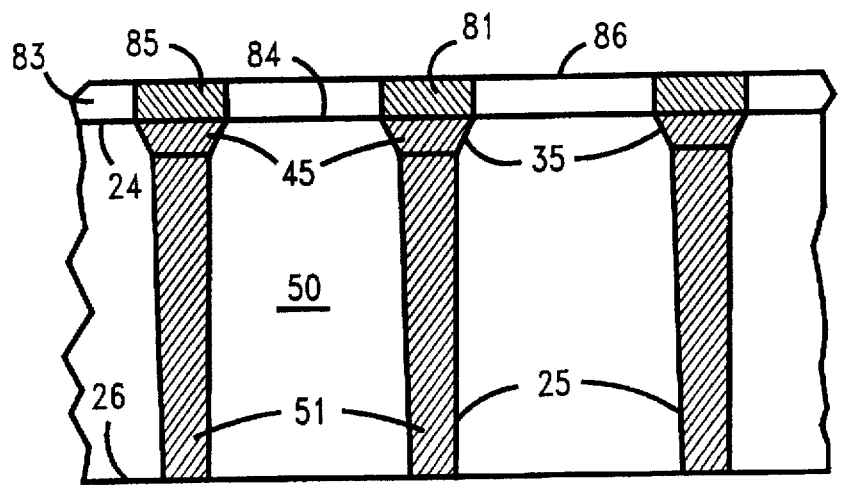
FIG. 9, is a cross-sectional view of yet another embodiment of the invention.

This invention can also be used to form multi-step molds, where molds are progressively aligned and filled with varying materials to meet end product objectives. FIG. 9, is a cross-sectional view of yet another embodiment of the invention for applications that require multiple material preforms. These castings are formed by successively depositing decreasing melting point materials. This allows casting and attachment of a structure from relatively high temperature materials. This is done by mating a second mold layer to the first filled mold. The second mold's material has a lower melting point material and therefore it joins with the cast material in the first mold.

For the purposes of illustration, as shown in FIG. 9, a second mold 83, having a plurality of openings 85, and a lower surface 84, and an upper surface 86, was mated with the cast mold 50, having the cast solder 51. The second mold 83, has cast material 81, such as, solder 81, in the openings 85. It is preferred that the cross-sectional area of the base of the material 51, such as, base or head 45, is the same as or a little bit smaller than the cross-sectional area of the cast material 81. Of course the opening 85, could have a taper or a flare, which is similar to the taper 12, or the flare 11, as discussed earlier.

An example of this multi-material casting would be the casting of a first electrical interconnect 51, having for example, about 10 percent Sn and about 90 percent Pb by weight of solder (having a liquidus temperature of about 302° C.) in a first mold 50, such as, in cast mold 50, and then securing a second mold of Sn/Pb solder, having electrical interconnects 81, such as a 63 percent Pb and 37 percent Sn solder (having a liquidus temperature of about 183° C.) that has been cast in the second mold 83. Such a combination enables the attachment of the interconnects that are formed by the cast solder 51 and 81, at minimal temperature. The resulting array will exhibit close control of solder volumes, at low cost, with desirable fatigue characteristics. Unless otherwise specified, all compositions of the cast material are in weight percent.

When the metallic material is a solder, the range of the liquidus temperature of the solder is preferably between about 180° C. and about 380° C., and more preferably between about 200° C. and about 365° C., and most preferably between about 225° C. and about 365° C.

The solder injection or extrusion filling of molds for either direct cast/joining or casting for subsequent joining places demands on the physical configuration and material selection of the mold. For example, the mold cavities can be designed with straight or angled sides, so that the cast solder can be easily ejected as a finished part or preform or joined array. Similarly, extraction draft angle also helps to reduce the force that is needed during the removal of the mold after the cast solder has been joined to a semiconductor device.

It has been found that the flare, such as, flare 11 or 111, preferably is between about 1 degree to about 80 degree, and more preferably between about 5 degree to about 45 degree, and most preferably between about 5 degree to about 30 degree.

Solder cast feature aspect ratio has significant bearing on the draft angle requirement. Arrays of cast solder features with aspect ratios (length:width) in excess of 20:1 have successfully been made with draft angles as low as one degree. It was noticed that solder cast features of small size and repetition per mold with less than a 1:1 aspect ratio could sometimes forgo the need for release angle, depending upon the force needed to overcome the initial breakaway and the strength of the mold material.

Different types of molds were made and tested. Molds can be of blind or through hole design.

The method of filling the mold with the solder material has direct bearing on mold cavity orientation due to the fill forces involved. Injection Molded Solder (IMS) process utilizes atmospherically evacuated mold voids to induce filling as opposed to extrusion methods utilizing positive pressure. In the case of through-hole molds, using IMS applications, filling from the smaller opening was preferred due to the decreased likelihood of cross-leakage (from solder supply to evacuation port area). It was found that extrusion methods generally favor a decreasing cross-section for void-free fill.

Taper angle can also be a useful molded material retention feature, especially when molds are filled and stocked. This may take the form of a single taper 35, as shown in FIG. 2, or dual taper 57 and 58, as illustrated in FIG. 6. The dual taper was found to enhance ease of handling. The release of dual taper features depends upon the volume displacement that occurs during subsequent attach, such as, by wetting. Of course the taper used should be properly calculated, which would basically depend upon the mold material used, the metallic material that would be cast in that mold, the casting size, the aspect ratio, etc.

Still another angle or compound angle application serves to ensure positive molten material contact with the attachment or "wetted" surfaces involving the employment of a shallow annular design feature. This utilizes the tendency of molten materials to assume a spherical shape, especially in an inert atmosphere.

It has been seen that a feature with a shallow flare at one extremity can be cast with a relatively flat surface on this end. Upon being positioned adjacent to a wettable surface and achieving melting temperature, the flat area will tend to bulge out. This allows accommodation of considerable gaps between mold and attachment surface due to part (substrate) flatness and positioning tolerances. The limitation of the aforementioned wettable surface will define the extent of the material deposition.

Locating and alignment considerations become mandatory for mold applications with high feature counts and/or small size. These positioning designs may be simple locator surfaces or interact with an alignment mechanism that enables optimal alignment of mold array to an attachment pattern or registration mark(s) on an end product. The pattern and edge tolerances of parts to be processed will best define the degree of locating sophistication needed.

Molding of finished shapes, such as pins, spheres, bullets and others, is accomplished by providing for ejection and possible re-processing to achieve the ultimate desired shape. The close control of casting material volume possible with this method is advantageous to this application.

The mold material that is selected must be able to maintain dimensional stability throughout the expected number of molding cycles. Similarly, the mold material must be able to provide continuous service at the desired process temperatures. Maintenance of flatness and surface finish is critical for injection molding. The surface condition, internal grain structure and gas permeability of mold materials will affect mold fill, casting yield, release performance and durability. As cast feature size decreases (on the order of about 0.5 mm or less) the sensitivity of the process to effects of surface tension, gas entrapment, and molding medium viscosity increases.

For array transfer applications, the mold material that is selected also needs to possess a close thermal coefficient of expansion value to the particular device or substrate that the molded array will be attached to. Incompatible coefficients of expansion will result in problems with registration, stress distortion of mold or part or both, and difficult array extraction. In the case of rapid heating and cooling processes, attention needs to be paid to rates of emissivity and heat transfer for the same reasons, although mass compensation and shadowing techniques can be utilized to minimize the effects of this type of a mismatch. The range of thermal excursion experienced by solder casting processes requires expansion matching of the entire alignment hardware set.

Another requirement for the mold material is that it be inert with regard to the casting medium. It should not chemically interact with the materials cast in any way. This affects the longevity of the mold, as some materials (liquid solder) are somewhat reactive to metallic molds.

Mold/fixture erosion also represents a contamination source to the resulting castings. Molding generated contaminants should be carefully considered. A contaminated cast array may possess sufficient structural integrity to withstand manufacturing, testing and assembly stresses, but subsequently fatigue fail (prematurely) in service. This non-reactive requirement may be achieved through the use of surface treatments such as anodizing or vitrification, with attention to the surface condition and permeability effects as mentioned previously.

The mold should be manufactured from a material having a coefficient of expansion matching the substrate, having properties of non-wettability to the casting material dimensional stability, and compatibility with the temperatures used during reflow. The preferred mold is a thermal expansion matched graphite.

The preferred mold design should contain a single or a double retention chamfer. This single or double chamfer allows for ease of mold handling prior to the joining of the molded solder to the substrate. As stated earlier that during the reflow process, the solder in the retention chamfer forms a rounded tip due to solder surface tension and thus allows for mold extraction. At the completion of the joining cycle, ejection hardware draws the mold from the joined solder column features.

One advantage of this invention is that the mold defines the shape of the feature to be manufactured. The solder within the mold undergoes minimal volume movement during the solder reflow attachment to the substrate. This is in contrast to preform methods which depend on gravity to provide uniform slump of mold material in spite of surface tension and surface films. This minimal displacement reduces the potential for casting defects due to surface oxides, contamination, and out-gassing. The use of pre-filled solder molds for forming interconnections results in significantly higher yields than were previously achievable.

As stated earlier, atmospheric oxygen content has a significant effect upon molten solder behavior. A low oxygen level will allow surface tension forces to form spherical, or nearly spherical, surfaces at the open end or ends 43, 44 of a mold void. An oxygen level of less than 500 PPM (Parts Per Million) will allow minimal restriction of this surface tension effect.

This effect can be undesirable in some applications, especially if solder preform retention is critical. An oxygen level of 3,000 to 5,000 PPM will cause the deposited solder to maintain the mold void shape rather than assume the above mentioned spherical shape, as shown by numerals 45 and 71.

As stated earlier, the formation of the metallic material or the cooling of the mold, could be done in an inert or reducing atmosphere. However, the atmosphere for this step could be selected from a group comprising of argon, carbon dioxide, forming gas, helium, hydrogen, nitrogen atmosphere, to name a few.

The dimensional nature of mold voids, cross section, aspect ratio, and angle will dictate the effects of oxygen level. For example, a small (0.5 mm) diameter, low aspect ratio (0.5 mm deep) mold void will fill adequately and reliably; however, in a very low oxygen atmosphere the solder will tend to assume a completely spherical shape. This sphere will not accurately maintain a location grid once solidified since it will be free to move independently with the mold void. Alternatively, the small (0.5 mm) diameter mold void with a high aspect ratio (3.0 mm deep) will maintain position within the mold while presenting a spherical end for subsequent joining process. A mold void with a much larger cross section (2 mm) will be less subject to surface tension effect.

EXAMPLE

The following example is intended to further illustrate the invention and is not intended to limit the scope of the invention in any manner.

EXAMPLE 1

The process of filling the mold cavities 25, with the solder 41, was accomplished with a solder injection apparatus (U.S. Pat. No. 5,244,143 Ference et al., the disclosure of which is incorporated herein by reference). The feed rate for the mold 23, through the injection apparatus was maintained at about 3.16 mm (0.125 inch) per second. 90 Pb/10 Sn (by weight) solder was used to fill the graphite molds to form the interconnect structures.

The maximum mold feed rate was limited by several factors; such as, for example, (a) the volume of the mold voids 25, (b) the maximum solder flow rate capacity of the injection molding head, and (c) the mold heating capability of the injection molding machine.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for making transferable cast metallic interconnect using a stand-alone mold, comprising the steps of:
   (a) placing metallic material in a liquid state, into at least one hole in said stand-alone mold, wherein said at least one hole in said stand-alone mold has at least two different internal slopes, (b) cooling said metallic material in said stand-alone mold to the solidus temperature of said metallic material, and thereby forming said cast metallic interconnect in said stand-alone mold.

2. The process of claim 1, wherein said hole in said mold is a through hole.

3. The process of claim 1, wherein said hole in said mold is a blind hole.

4. The process of claim 1, wherein said hole has a taper.

5. The process of claim 1, wherein said mold material is selected from a group consisting of boron nitride, ceramic, copper, epoxy, glass, graphite, metals, metallic ceramics, molybdenum, plastic, polyimides and silicon.

6. The process of claim 1, wherein said metallic material is selected from a group consisting of aluminum, antimony, bismuth, conductive epoxies, copper, gold, lead, silver, solder and tin.

7. The process of claim 6, wherein said solder consists by weight of between about 1 percent to about 97 percent lead.

8. The process of claim 6, wherein said solder consists by weight of between about 63 percent to about 95 percent lead.

9. The process of claim 6, wherein said solder consists by weight of about 90 percent lead.

10. The process of claim 6, wherein said solder consists by weight of between about 99 percent to about 3 percent tin.

11. The process of claim 6, wherein said solder consists by weight of between about 37 percent to about 5 percent tin.

12. The process of claim 6, wherein said solder consists by weight of about 10 percent tin.

13. The process of claim 1, wherein said metallic material is a solder, and wherein the liquidus temperature of said solder is between about 180° C. and about 380° C.

14. The process of claim 1, wherein said metallic material is a solder, and wherein the liquidus temperature of said solder is between about 200° C. and about 365° C.

15. The process of claim 1, wherein said metallic material is a solder, and wherein the liquidus temperature of said solder is between about 225° C. and about 365° C.

16. The process of claim 1, wherein said hole has a flare at at least one end.

17. The process of claim 16, wherein at least one of said flare is between about 1 degree to about 80 degree.

18. The process of claim 16, wherein at least one of said flare is between about 5 degree to about 45 degree.

19. The process of claim 16, wherein at least one of said flare is between about 5 degree to about 30 degree.

20. The process of claim 1, wherein the shape of said opening in said mold is selected from a group consisting of triangular shape, rectangular shape, polygonal shape, elliptical shape and any irregular shape.

21. The process of claim 1, wherein at least one backing plate is secured to said mold prior to said placement of said metallic material.

22. The process of claim 1, wherein at least one backing plate is secured to said mold, and said backing plate is removed after said metallic material has reached its solidus state.

23. The process of claim 1, wherein said cooling step is done in an inert or reducing atmosphere.

24. The process of claim 23, wherein said atmosphere is selected from a group consisting of argon, carbon dioxide, forming gas, helium, hydrogen and nitrogen.

25. A mold having cast metallic interconnects made by the process of claim 1.

26. The mold of claim 25, wherein said mold has a hole with a taper.

27. The mold of claim 25, wherein the material for said mold is selected from a group consisting of boron nitride, ceramic, copper, epoxy, glass, graphite, metals, metallic ceramics, molybdenum, plastic, polyimides and silicon.

28. The mold of claim 25, wherein said mold has at least one hole and wherein at least one metallic material fills said hole and wherein said metallic material is selected from a group consisting of aluminum, antimony, bismuth, conductive epoxies, copper, gold, lead, silver, solder and tin.

29. The mold of claim 28, wherein said solder consists by weight of between about 1 percent to about 97 percent lead.

30. The mold of claim 28, wherein said solder consists by weight of between about 63 percent to about 95 percent lead.

31. The mold of claim 28, wherein said solder consists by weight of about 90 percent lead.

32. The mold of claim 28, wherein said solder consists by weight of between about 99 percent to about 3 percent tin.

33. The mold of claim 28, wherein said solder consists by weight of between about 37 percent to about 5 percent tin.

34. The mold of claim 28, wherein said solder consists by weight of about 10 percent tin.

35. The mold of claim 25, wherein said metallic material is a solder, and wherein the liquidus temperature of said solder is between about 180° C. and about 380°.

36. The mold of claim 25, wherein said metallic material is a solder, and wherein the liquidus temperature of said solder is between about 200° C. and about 365° C.

37. The mold of claim 25, wherein said metallic material is a solder, and wherein the liquidus temperature of said solder is between about 225° C. and about 365° C.

38. The mold of claim 25, wherein said mold has at least one hole and wherein said hole has a flare at at least one end.

39. The mold of claim 38, wherein at least one of said flare is between about 1 degree to about 80 degree.

40. The mold of claim 38, wherein at least one of said flare is between about 5 degree to about 45 degree.

41. The mold of claim 38, wherein at least one of said flare is between about 5 degree to about 30 degree.

42. The mold of claim 25, wherein at least one backing plate is secured to said mold.

43. The mold of claim 25, wherein said cooling of said mold is done in an atmosphere selected from either inert or reducing atmosphere.

44. The mold of claim 43, wherein said atmosphere is selected from a group consisting of argon, carbon dioxide, forming gas, helium, hydrogen and nitrogen.

* * * * *